US008134861B2

(12) United States Patent
Nakadai

(10) Patent No.: US 8,134,861 B2
(45) Date of Patent: Mar. 13, 2012

(54) MEMORY ACCESS METHOD AND SEMICONDUCTOR MEMORY DEVICE

(75) Inventor: Hiroshi Nakadai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 108 days.

(21) Appl. No.: 12/382,243

(22) Filed: Mar. 11, 2009

(65) Prior Publication Data

US 2009/0296498 A1    Dec. 3, 2009

(30) Foreign Application Priority Data

May 28, 2008    (JP) ................................ 2008-140119

(51) Int. Cl.
*G11C 11/00* (2006.01)
(52) U.S. Cl. ............ 365/154; 365/189.14; 365/189.011; 365/230.06
(58) Field of Classification Search ............. 365/189.14, 365/189.011, 230.06, 154
See application file for complete search history.

(56) References Cited

U.S. PATENT DOCUMENTS

| 5,519,655 A | * | 5/1996 | Greenberg | ............... 365/189.02 |
| 6,038,176 A | * | 3/2000 | Shyu | ........................ 365/189.14 |
| 6,144,055 A | * | 11/2000 | Takenaka | ..................... 257/301 |
| 6,563,758 B2 | * | 5/2003 | Shau | ........................ 365/230.05 |
| 7,092,279 B1 | * | 8/2006 | Sheppard | ..................... 365/154 |

FOREIGN PATENT DOCUMENTS

JP    2003-16786    1/2003

* cited by examiner

*Primary Examiner* — Vu Le
*Assistant Examiner* — Han Yang
(74) *Attorney, Agent, or Firm* — Staas & Halsey LLP

(57) ABSTRACT

A semiconductor memory device includes a memory cell array provided with blocks each having a plurality of memory cells arranged in columns and rows, a column selection circuit selecting a column via bit lines based on a column section signal, a word line driver circuit selecting a row via a word line based on a row selection signal and the column selection signal, and a write/read circuit writing data to and reading data from a selected memory cell via the bit lines based on a write and read switching signal. The selected memory cell is arranged at a position determined by the column selected by the column selection circuit and the row selected by the word line driver circuit within one block. Rows corresponding to the blocks are provided in common with the same number of word lines as the columns, and the memory cells arranged in one row within one block are coupled to mutually different word lines.

9 Claims, 15 Drawing Sheets

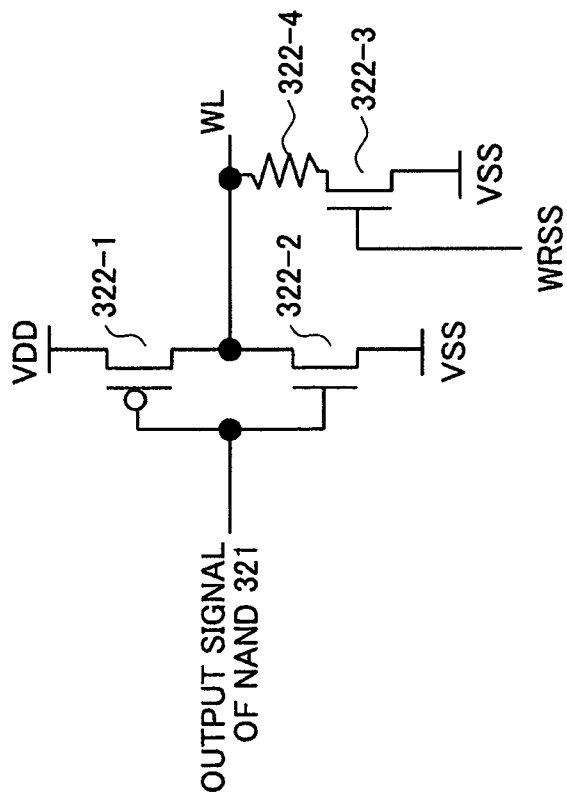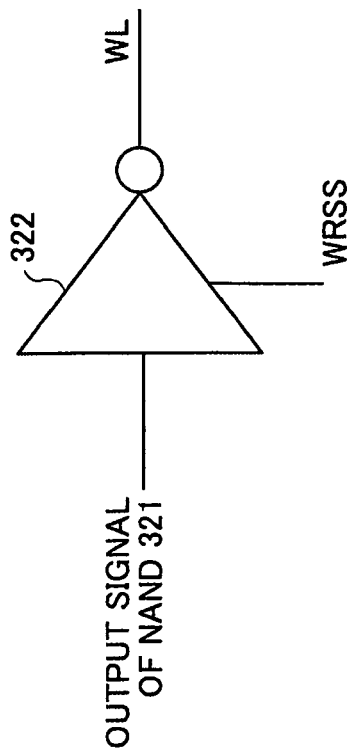
FIG.4B
FIG.4A

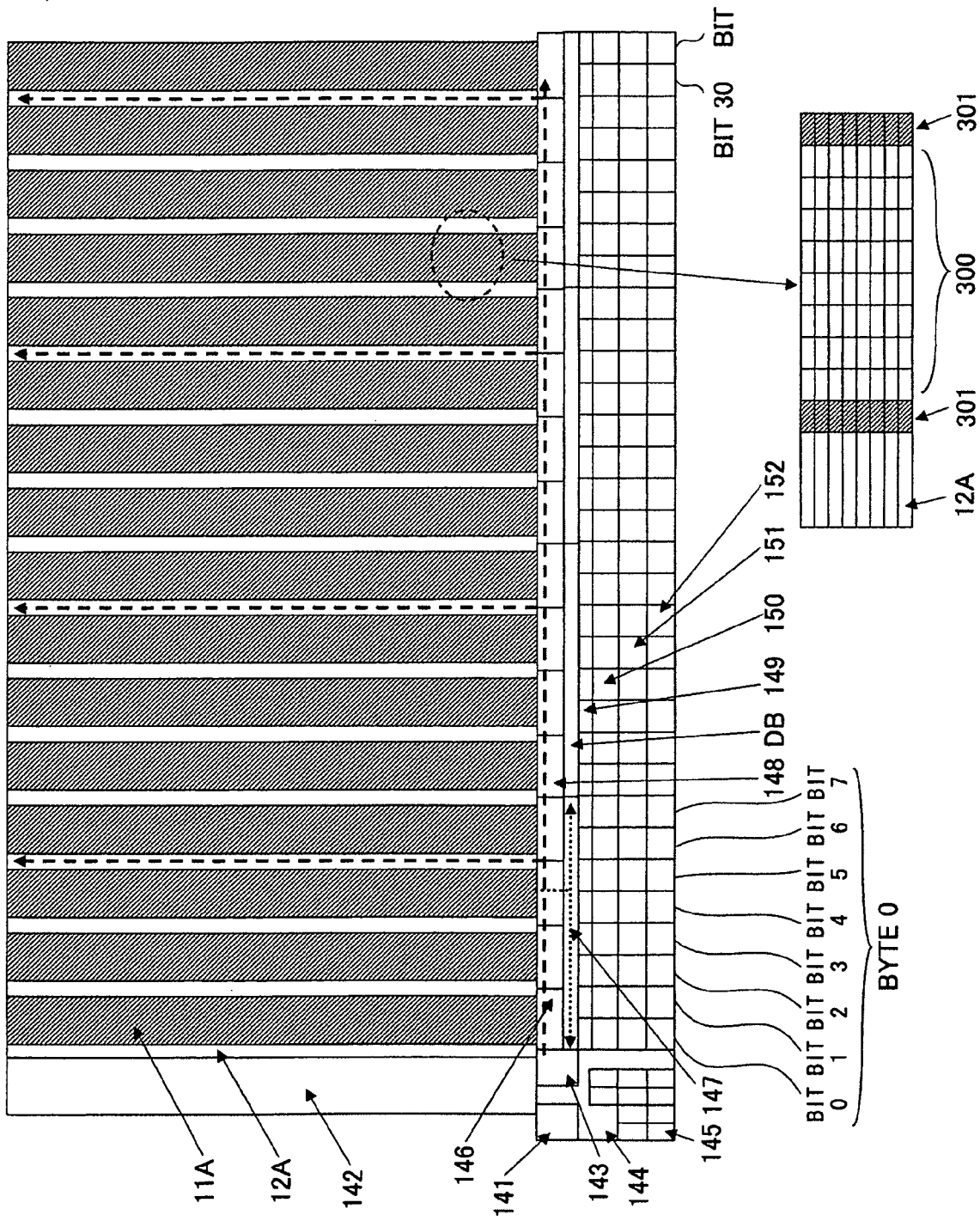

MEMORY ACCESS METHOD AND SEMICONDUCTOR MEMORY DEVICE

CROSS-REFERENCE TO RELATED APPLICATIONS

This application is based upon and claims the benefit of priority of the prior Japanese Patent Application No. 2008-140119, filed on May 28, 2008, the entire contents of which are incorporated herein by reference.

FIELD

The present invention generally relates to memory access methods and semiconductor memory devices, and more particularly to a memory access method which controls a word line to potentials that are different for writing data and reading data, and to a semiconductor memory device which employs such a memory access method.

BACKGROUND

A read stability and a write performance of memory cells within a semiconductor memory device have a tradeoff relationship. Recently, due to the increased integration density of the semiconductor memory device, inconsistencies in electrical characteristics, particularly threshold values, of transistors forming the memory cells have increased to an extent which is no longer negligible. Because of the above inconsistencies in the threshold values, it is becoming increasingly difficult to simultaneously achieve the desired read stability and the desired write performance of the memory cells. The read stability improves by setting the threshold values of the transistors forming the memory cells to a high value, but the write performance is deteriorated thereby.

In general, the read stability improves when a potential of a word line in the semiconductor memory device is decreased, but the write performance consequently deteriorates. In the conventional semiconductor memory device, the read stability and the write performance can be simultaneously achieved even when the potential of the word line is set to a power supply voltage when this word line is selected. However, due to the above described increase in the inconsistencies caused by the increased integration density of the semiconductor memory device, it is becoming more difficult to simultaneously achieve the read stability and the write performance. Hence, a method has been proposed in which the word line potential at the time of reading is set lower than the power supply voltage in order to improve the read stability, and the word line potential at the time of writing is set higher than that at the time of reading in order to prevent deterioration of the write performance. According to this proposed method, the threshold values of the transistors forming the memory cells are set in the same manner as in the case of the conventional semiconductor memory device, and the threshold values are not set to a particularly high value.

FIG. 1 is a circuit diagram illustrating a first example of a conventional semiconductor memory device. A semiconductor memory device 1-1 illustrated in FIG. 1 includes a memory cell array 11, a word line driver circuit 12, a column selection circuit 13, and a write and read circuit (hereinafter simply referred to as a write/read circuit) 14. Each memory cell MC within the memory cell array 11 is connected to a word line WL and bit lines BL and /BL. In this example, the semiconductor memory device 1-1 forms a static random access memory (SRAM). In the memory cell array 11, a row is selected by selecting the word line WL, and a column is selected by selecting the bit line pair BL and /BL. One bit line BL and a bit line /BL forming a pair with this one bit line BL are supplied with mutually inverted signals when selected. In FIG. 1, RSS denotes a row selection signal, CSS denotes a column selection signal, WRSS denotes a write and read switching signal (hereinafter simply referred to as a write/read switching signal), and DB denotes a data bus. For example, if the memory cell array 11 amounts to 1 kilo-words (Kwords), the memory cells MC amounting to {(128 rows) *(4 columns)}*{4 bytes (=32 bits)} are provided, where 1*11 denotes a multiplication.

A description will be given of a case where the potential of the word line WL is changed between the time of writing and the time of reading in the semiconductor memory device 1-1 having the structure illustrated in FIG. 1. If the potential of the word line WL at the time of writing is set higher than that at the time of reading, the memory cells MC in each column in which the word line WL is selected but the bit line pair BL and /BL is not selected assume a state similar to a reading state, and there is a possibility that data held by the memory cells MC in the state similar to the reading state will be destroyed.

On the other hand, depending on the structure of the semiconductor memory device 1-1, the writing and the reading are performed for every byte that is connected to the same word line WL. In such a structure, there is a possibility that the required potential of the word line WL will be different depending on the memory cells MC, even among the memory cells MC connected to the same word line WL.

Hence, a semiconductor memory device having a structure described in a Japanese Laid-Open Patent Publication No. 2003-16786 has been proposed. FIG. 2 is a circuit diagram illustrating a second example of the conventional semiconductor memory device. In FIG. 2, those parts which are substantially the same as those corresponding parts in FIG. 1 are designated by the same reference numerals, and a description thereof will be omitted. A semiconductor memory device 1-2 illustrated in FIG. 2 has a structure corresponding to that proposed in the Japanese Laid-Open Patent Publication No. 2003-16786. In the semiconductor memory device, a voltage variable word line driver circuit 12A is provided in place of the word line driver circuit 12 illustrated in FIG. 1. By connecting a different word line WL for each column, it is possible to avoid generation of a memory cell MC for which the column is not selected even though the word line WL is selected within a memory cell array 11A. In addition, the word line WL is set to a potential suitable for the writing at the time of writing and to a potential suitable for the reading at the time of reading. In the semiconductor memory device 1-2, identical (or corresponding) columns are grouped into blocks, and each block is driven by a separate word line WL.

However, according to the semiconductor memory device 1-2 illustrated in FIG. 2, the wiring length of the data bus DB to which the bit line pair BL and /BL is connected becomes extremely long because the identical columns are grouped into the blocks, and the operation speed of the semiconductor memory device 1-2 greatly deteriorates. For this reason, the structure of the semiconductor memory device 1-2 is unsuited for a cache SRAM for use in high-end processors which particularly require high-speed operation.

In order to compensate for the deterioration of the operation speed of the semiconductor memory device 1-2, it is conceivable to provide a sense amplifier for each bit line pair BL and /BL. But in this case, an area occupied by the sense amplifier is not negligible since a large number of sense amplifiers will be provided, which goes against the demands to increase the integration density of the semiconductor memory device 1-2.

In addition, in the semiconductor memory device 1-2, an area occupied by the data bus DB increases, and the number of write/read circuits 14A provided for each byte also increases. Moreover, in the production process of the memory cell array 11A, characteristic deteriorations and pattern (or shape) defects of the memory cells MC are generated due to discontinuities occurring at exposure and processing stages, and for this reason, it is necessary to provide dummy cells in a periphery of functioning cells which actually function in a normal manner. When the memory cell array 11A is segmented for each byte, the number of dummy cells to be provided on the outer periphery of the memory cells MC which are used as the functioning cells, in order to compensate for the characteristic deteriorations and the pattern defects, will amount to the number of segments, which goes against the demands to increase the integration density of the semiconductor memory device 1-2.

According to the conventional semiconductor memory device, there was a problem in that it is difficult to improve the read stability and the write performance, without greatly interfering with the demands to increase the integration density of the semiconductor memory device.

SUMMARY

Accordingly, it is an object in one aspect of the present invention to provide a novel and useful memory access method and semiconductor memory device, in which the problems described above are suppressed.

One aspect of the present invention is to provide a memory access method and a semiconductor memory device which can improve the read stability and the write performance, without greatly interfering with the demands to increase the integration density of the semiconductor memory device.

According to one aspect of the present invention, there is provided a semiconductor memory device comprising a memory cell array provided with a plurality of blocks each having a plurality of memory cells arranged in a plurality of columns and a plurality of rows; a column selection circuit configured to select a column via bit lines based on a column section signal; a word line driver circuit configured to select a row via a word line based on a row selection signal and the column selection signal; and a write and read circuit configured to write data to and to read data from a selected memory cell, via the bit lines, based on a write and read switching signal, the selected memory cell being arranged at a position determined by the column selected by the column selection circuit and the row selected by the word line driver circuit within one block, wherein rows corresponding to the plurality of blocks are provided in common with the same number of word lines as the plurality of columns, and the memory cells arranged in one row within one block are coupled to mutually different word lines.

According to another aspect of the present invention, there is provided a memory access method for a semiconductor memory device having a memory cell array provided with a plurality of blocks each having a plurality of memory cells arranged in a plurality of columns and a plurality of rows, wherein rows corresponding to the plurality of blocks are provided in common with the same number of word lines as the plurality of columns, and the memory cells arranged in one row within one block are coupled to mutually different word lines, the memory access method comprising selecting a column via bit lines based on a column section signal; selecting a row via a word line based on a row selection signal and the column selection signal; and writing data to and reading data from a selected memory cell, via the bit lines, based on a write and read switching signal, the selected memory cell being arranged at a position determined by the column selected by the column selection circuit and the row selected by the word line driver circuit within one block, wherein a potential of the word line at a time of writing is set to a voltage higher than a potential of the word line at a time of reading.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 4A and 4B are diagrams for explaining a voltage variable inverter circuit;

FIG. 15 is a diagram illustrating a layout of the semiconductor memory device illustrated in FIG. 2.

DESCRIPTION OF EMBODIMENTS

Preferred embodiments of the present invention will be described with reference to the accompanying drawings.

According to one aspect of the present invention, a semiconductor memory device comprises a memory cell array provided with a plurality of blocks each having a plurality of memory cells arranged in a plurality of columns and a plurality of rows, wherein corresponding rows of the plurality of blocks are provided in common with the same number of word lines as the plurality of columns, and the memory cells arranged in one row within one block are connected to mutually different word lines.

According to one aspect of the present invention, a memory access method selects a column via a bit line based on a column selection signal, and selects a row via a word line based on a row selection signal and the column selection signal. Writing of data to and reading of data from one selected memory cell which is arranged at a position determined by one column and one row selected within one block are performed via the bit line based on a write and read switching signal. A potential of the word line at the time of writing is set to a voltage which is higher than a potential of the word line at the time of reading.

According to one aspect of the present invention, it is possible to realize a memory access method and a semiconductor memory device which can improve the read stability and the write performance, without greatly interfering with demands to increase the integration density of the semiconductor memory device.

A description will now be given of each embodiment of the memory access method and the semiconductor memory device according to the present invention, by referring to FIG. 3 and the subsequent figures.

Figure 1:
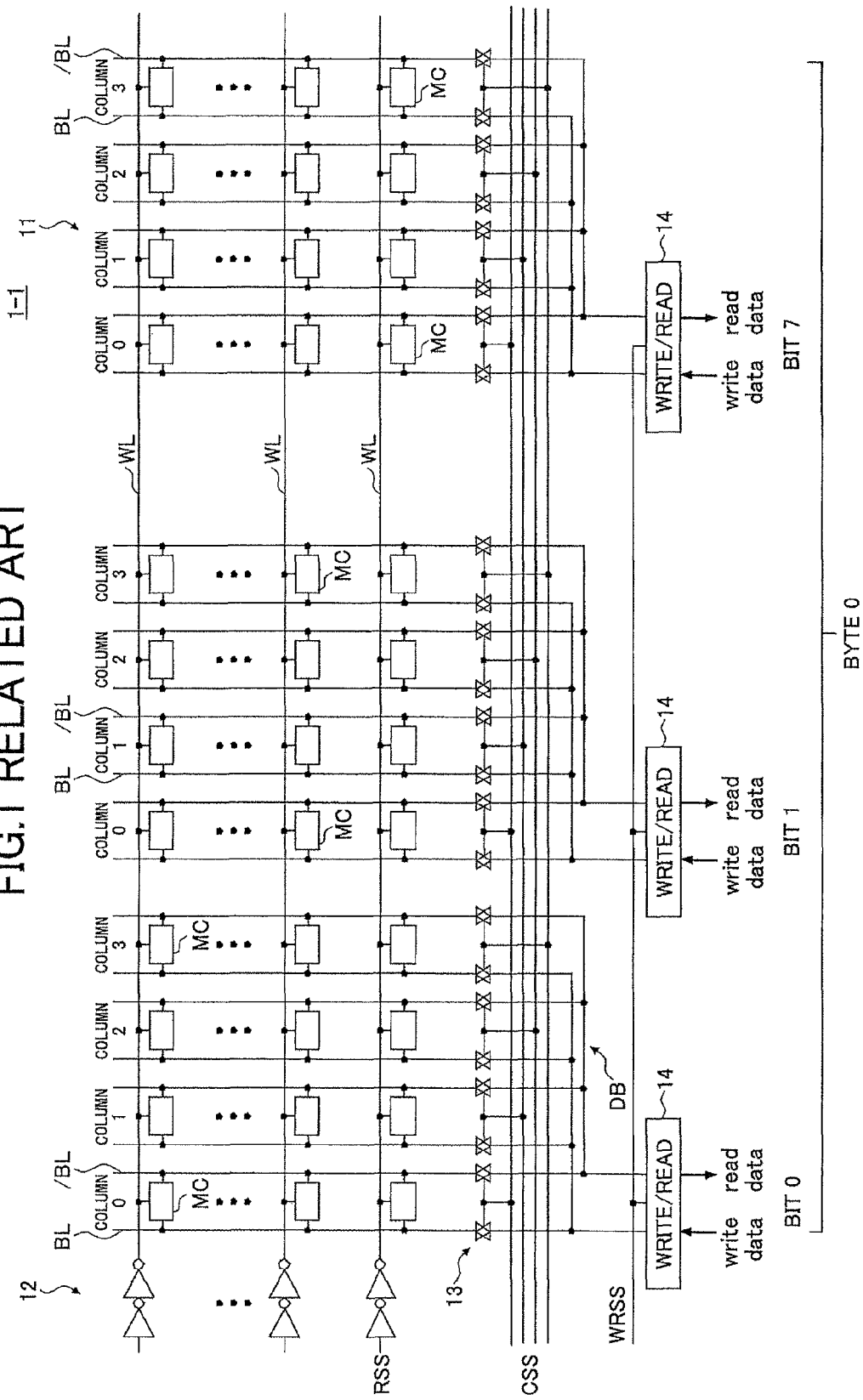
FIG. 1 is a circuit diagram illustrating a first example of a conventional semiconductor memory device.
Figure 3:
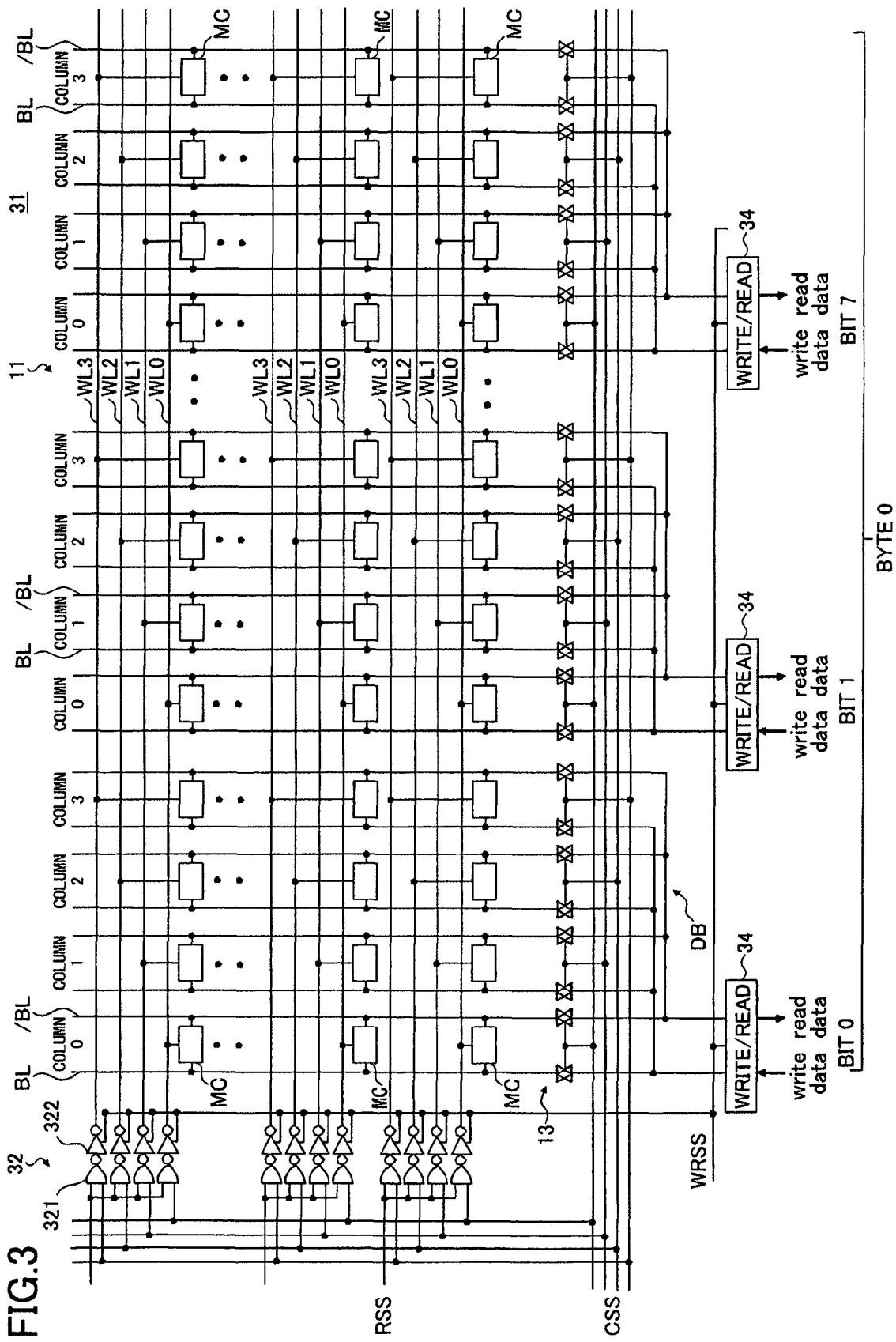
FIG. 3 is a circuit diagram illustrating a semiconductor memory device in an example of an embodiment of the present invention.

FIG. 3 is a circuit diagram illustrating a semiconductor memory device in an example of an embodiment of the present invention. In FIG. 3, those parts that are substantially the same as those corresponding parts in FIG. 1 are designated by the same reference numerals, and a description thereof will be omitted. A semiconductor memory device 31 illustrated in FIG. 3 includes a memory cell array 11, a word line driver circuit 32, a column selection circuit 13, and a write and read circuit (hereinafter simply referred to as a write/read circuit) 34. Each memory cell MC within the memory cell array 11 is connected to a word line WL and bit lines BL and /BL. In this example, the semiconductor memory device 31 forms a complementary metal oxide semiconductor (CMOS) static random access memory (SRAM), that is, CMOS-SRAM, using 6-transistor type memory cells. In the memory cell array 11, a row is selected by selecting the word line WL, and a column is selected by selecting the bit lines BL and /BL. In FIG. 3, RSS denotes a row selection signal, CSS denotes a column selection signal, WRSS denotes a write and read switching signal (hereinafter simply referred to as a write/read switching signal), and DB denotes a data bus. For example, if the memory cell array 11 amounts to 1 kilo-words (Kwords), the memory cells MC amounting to {(128 rows)*(4 columns)}*{4 bytes (=32 bits)} are provided, where "*" denotes a multiplication. Of course, the number of rows, the number of columns and the number of bits are not limited to those illustrated in FIG. 3.

In this embodiment, a part of the memory cell array 11 illustrated in FIG. 3 is segmented into 8 blocks corresponding to 8 bits, and each block has columns 0 through 3. In addition, word lines WL0 through WL3 are connected to the corresponding columns 0 through 3 of each of the blocks. In other words, 4 word lines WL0 through WL3 are provided in each row. One column selection circuit 13 and one write/read circuit 34 are provided with respect to each block. On the other hand, one word line driver circuit 32 is provided in common with respect to all blocks in one row, with respect to one corresponding word line.

For example, data of bit 0 of byte 0 is written to a memory cell MC within the memory cell array 11 via one corresponding write/read circuit 34, the data bus DB and the column selection circuit 13, and read from this memory cell MC via the column selection circuit 13, the data bus DB and the corresponding write/read circuit 34. In this example illustrated in FIG. 3, the data of bit 0 of byte 0 is written to and read from the memory cell MC which is connected to the word line selected by the word line driver circuit 32 in response to the row selection signal RSS and is connected to the bit line pair BL and /BL selected by the column selection circuit 13 in response to the column selection signal CSS, from among the memory cells MC within the leftmost block in FIG. 3.

A description will be given of a case where the potential of the word lines WL0 through WL3 is changed between the time of writing and the time of reading in the semiconductor memory device 31 having the structure illustrated in FIG. 3. If the potential of the word lines WL0 through WL3 at the time of writing is set higher than that at the time of reading, the memory cells MC in each column in which one of the word lines WL0 through WL3 is selected but the bit line pair BL and /BL is not selected will not assume a state similar to a reading state. Hence, a phenomenon in which the data held by the memory cells MC in the state similar to the reading state become destroyed will not occur. For example, in a case where the potential of the word lines WL0 through WL3 at the time of writing is set to a power supply voltage VDD, the potential of the word lines WL0 through WL3 at the time of reading is set to a voltage lower than the power supply voltage VDD. In addition, in the case of a semiconductor memory device using two kinds of power supply voltages VDD1 and VDD2 satisfying a relationship VDD1>VDD2, the potential of the word lines WL0 through WL3 at the time of writing may be set to the first power supply voltage VDD1, and the potential of the word lines WL0 through WL3 at the time of reading may be set to the second power supply voltage VDD2.

On the other hand, depending on the structure of the semiconductor memory device, the writing and the reading are performed for each byte that is connected to the same word line. In such a case, there is a possibility that the required potential of the word line will be different depending on the memory cells, even among the memory cells connected to the same word line. However, in the case of the semiconductor memory device 31 having the structure illustrated in FIG. 3, a situation where the required potential of the word line will be different depending on the memory cells MC, even among the memory cells MC connected to the same word line, will not occur.

According to the semiconductor memory device 31 having the structure illustrated in FIG. 3, the wiring length of the data bus DB may be the same as that of the first example of the conventional semiconductor memory device illustrated in FIG. 1, for example, and the high-speed operation speed can be maintained. For this reason, the structure of the semiconductor memory device 31 is suited for a cache SRAM for use in high-end processors which particularly require the high-speed operation. In addition, according to the semiconductor memory device 31, the area occupied by the data bus DB does not increase even when compared to the first example of the conventional semiconductor memory device illustrated in FIG. 1, and the number of write/read circuits 14A will not increase even when compared to the first example of the conventional semiconductor memory device illustrated in FIG. 1. Furthermore, the dummy cells provided on the outer periphery of the functioning cells will not considerably suppress the increase in the integration density of the semiconductor memory device 31, and it is therefore possible to cope with the demands to increase the integration density of the semiconductor memory device.

As will be described later, the effects of providing the word lines WL0 through WL3 with respect to each row and the word line driver circuit 32 on the demands to increase the integration density of the semiconductor memory device 31 are substantially negligible, and the demands to increase the integration density will not be interfered by the provision of the word lines WL0 through WL3 and the word line driver circuit 32. Rather, the provision of the word lines WL0 through WL3 and the word line driver circuit 32 contribute to the improvement of the read stability and the write performance.

Next, a description will be given of an example of the structure of the word line driver circuit 32. In this embodiment, the word line driver circuit 32 includes NAND circuits 321 and voltage variable inverter circuits 322 which are connected as illustrated in FIG. 3, with respect to each of the word lines WL0 through WL3. FIGS. 4A and 4B are diagrams for explaining the voltage variable inverter circuit 322. FIG. 4A illustrates the voltage variable inverter circuit 322, and FIG. 4B is a circuit diagram of the voltage variable inverter circuit 322. An output signal of the NAND circuit 321 which is input to the voltage variable inverter circuit 322, that is, the row selection signal RSS, selects a corresponding word line WL (WL0 through WL3) when having a low level, and makes a corresponding word line WL non-selected when having a high level. In addition, the write/read switching circuit WRSS which is input to the voltage variable inverter circuit 322 has a low level at the time of writing and has a high level at the time of reading.

The voltage variable inverter circuit 322 has transistors 322-1 through 322-3 and a resistor 322-4 which are connected as illustrated in FIG. 4B. In FIG. 4B, VDD denotes the power supply voltage, and VSS denotes the ground voltage.

Figure 5:
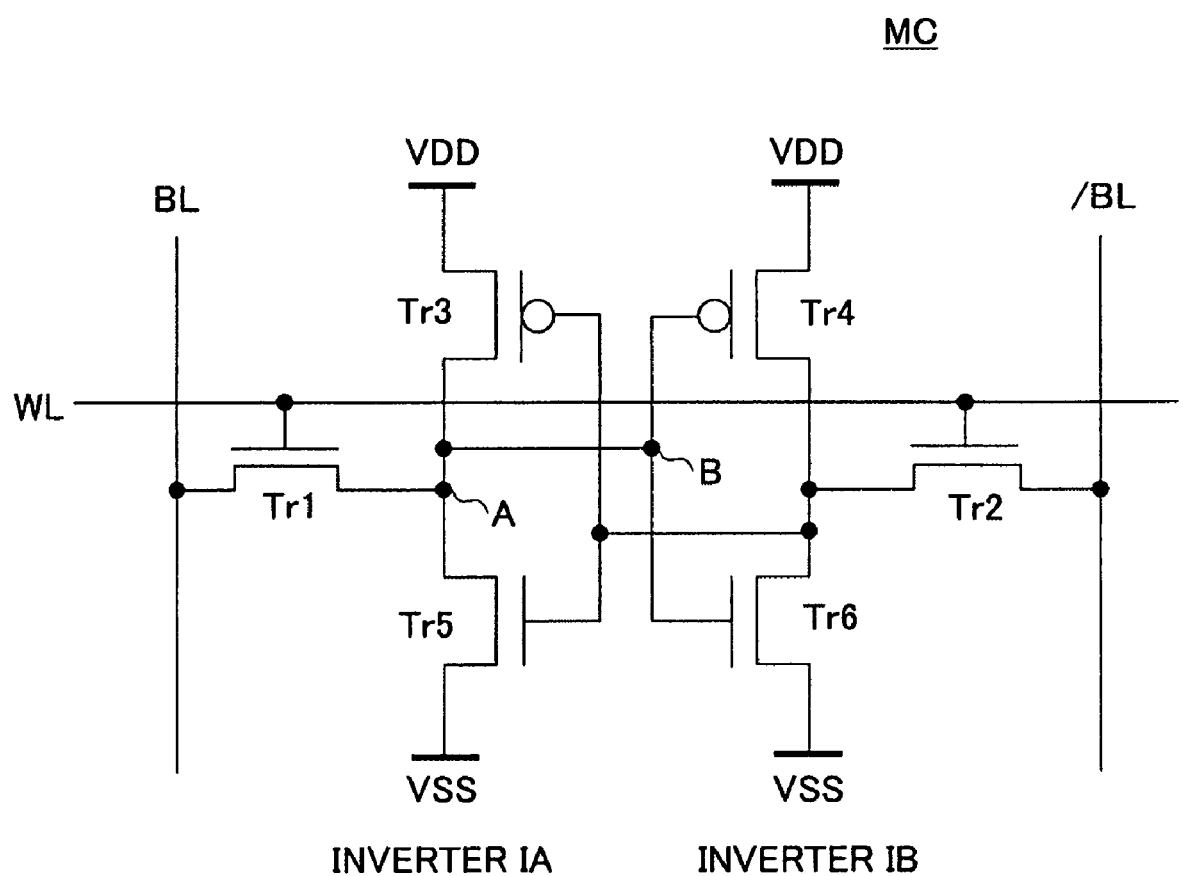
FIG. 5 is a circuit diagram illustrating a 6-transistor type memory cell.

Next, a description will be given of an example of the structure of the memory cell MC. In this embodiment, the memory cell array 11 is formed by the CMOS-SRAM using the 6-transistor type memory cells. FIG. 5 is a circuit diagram illustrating the 6-transistor type memory cell. The memory cell MC includes 6 transistors Tr1 through Tr6 which are connected as illustrated in FIG. 5 with respect to the bit line pair BL and /BL, the word line WL, the power supply voltage VDD and the ground voltage VSS. The transistors Tr3 and Tr5 form an inverter IA, and the transistors Tr4 and Tr6 form an inverter IB.

Figure 6:
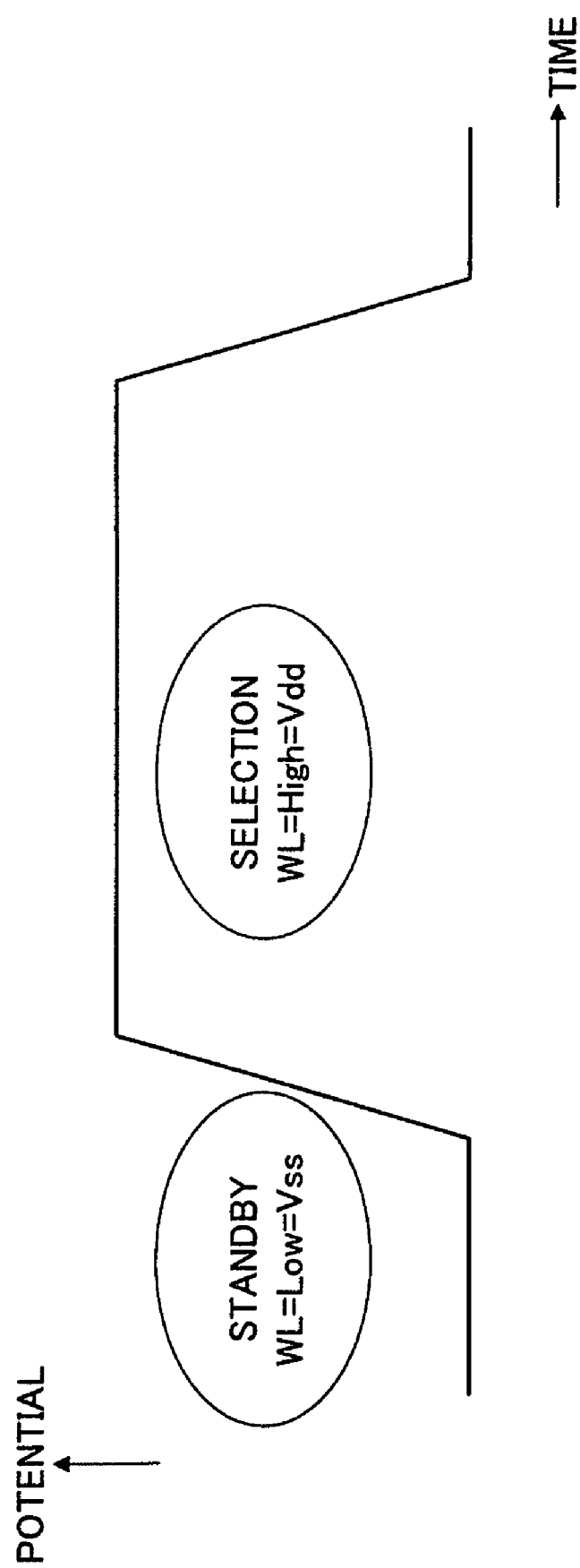
FIG. 6 is a diagram illustrating an internal potential of a memory cell at the time of reading.

FIG. 6 is a diagram illustrating an internal potential of the memory cell MC illustrated in FIG. 5 at the time of reading. In FIG. 6, the ordinate indicates the potential in arbitrary units, and the abscissa indicates the time in arbitrary units. In a standby state, the word line WL is set to the low level, that is, the ground voltage VSS. When the word line WL is selected, the word line WL is set to the high level, that is, the power supply voltage VDD.

When the word line WL is selected and set to the high level at the time of reading, the transistor Tr1 turns ON, and a read current flows to the ground from the bit line BL via the transistors Tr1 and Tr5. In this state, the potential at a node A rises from the ground voltage VSS depending on a ratio of the resistances of the transistors Tr1 and Tr5. The potential at the node A becomes an input to the inverter IB at a node B. Normally, even when the potential at the node A rises from the ground voltage VSS, the circuit is designed so that an output of the inverter IB will not change due to such a rise.

Figure 7:
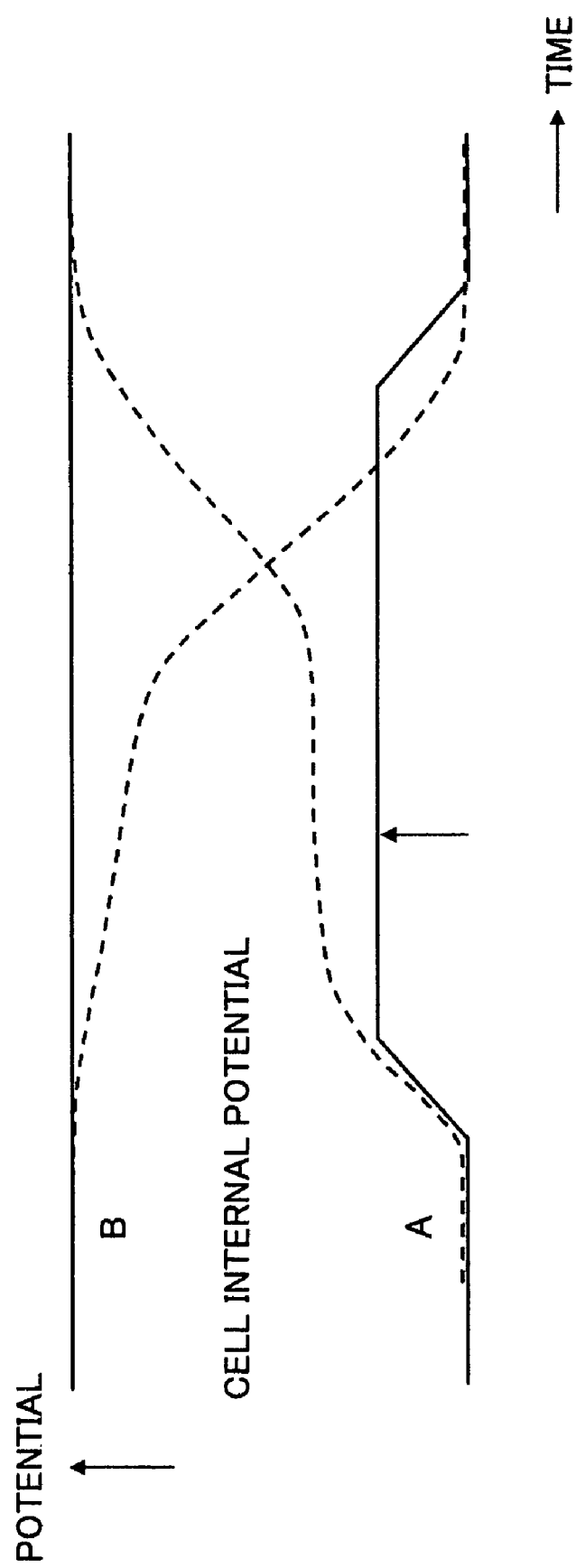
FIG. 7 is a diagram illustrating changes in potentials at nodes A and B caused by inconsistencies in electrical characteristics of transistors forming the memory cell.

However, as the integration density of the semiconductor memory device 31 increases, the inconsistencies in the electrical characteristics, particularly threshold values of the transistors Tr1 through Tr6 forming the memory cell MC increase to a level which is no longer negligible, the potential at the node A may rise to a non-negligible level as illustrated in FIG. 7 or, the characteristic of the inverter IB may greatly deviate from the designed values and invert the output of the inverter IB in response to the rise in the potential at the node A. The inversion of the output of the inverter IB means the destruction of the data held by the memory cell MC. FIG. 7 is a diagram illustrating changes in potentials at the nodes A and B caused by inconsistencies in the electrical characteristics of the transistors Tr1 through Tr6 forming memory cell MC. In FIG. 7, the ordinate indicates the potential in arbitrary units, and the abscissa indicates the time in arbitrary units.

In this embodiment, when the potential of the word line WL at the time of writing is set to the power supply voltage VDD, the potential of the word line WL at the time of reading is set to a voltage lower than the power supply voltage VDD. When the potential of the word line WL at the time of writing is set to a potential higher than that at the time of reading, the memory cell MC connected to the word line WL which is selected but connected to the bit line pair BL and /BL which is not selected will not assume a state similar to the reading state. Hence, a change indicated by broken lines in FIG. 7 will not occur at the nodes A and B, and a phenomenon in which the data held by the memory cell MC in the state similar to the reading state becomes destroyed will not occur.

Figure 8:
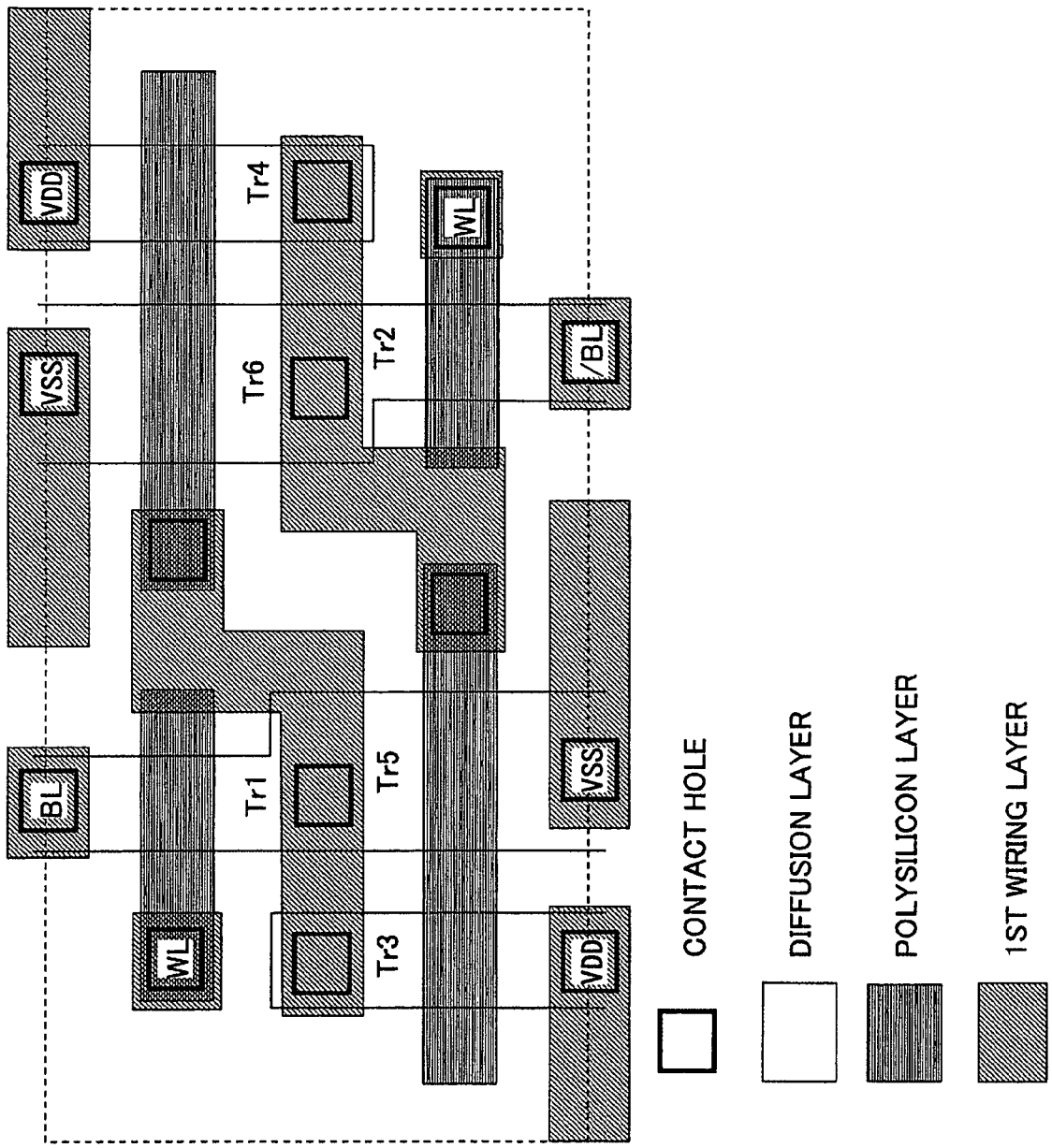
FIG. 8 is a diagram illustrating a layout of the memory cells from transistors up to a first wiring layer.

Next, a description will be given of a layout of the semiconductor memory device 31. FIG. 8 is a diagram illustrating the layout of the memory cells MC from the transistors up to a first wiring layer. In FIG. 8, those parts that are the same as those corresponding parts in FIG. 5 are designated by the same reference numerals, and a description thereof will be omitted. In FIG. 8, a rectangle indicated by a thin solid line denotes a diffusion layer, a region indicated by dark shade denotes a polysilicon layer, and a leftwardly descending hatching denotes a first wiring (or interconnection) layer. In addition, a square indicated by a bold solid line denotes a contact hole connecting the diffusion layer and the first wiring layer or, connecting the polysilicon layer and the first wiring layer.

Figure 9:
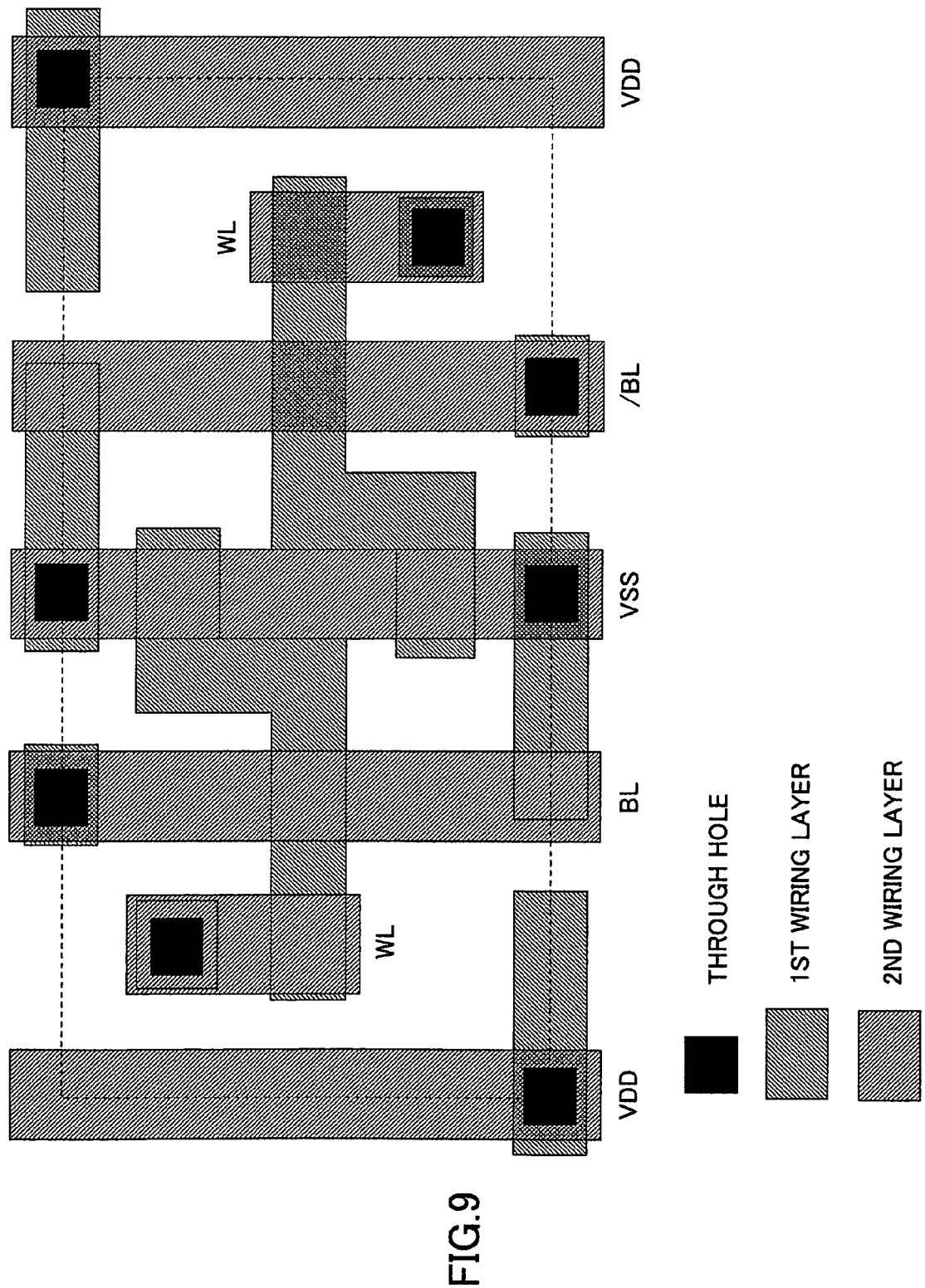
FIG. 9 is a diagram illustrating a layout of the memory cells from the first wiring layer up to a second wiring layer.

FIG. 9 is a diagram illustrating the layout of the memory cells MC from the first wiring layer up to a second wiring layer. In FIG. 9, a leftwardly descending hatching denotes the first wiring layer, a rightwardly descending hatching denotes the second wiring layer, and a black square denotes a through hole connecting the first and second wiring layers.

Figure 10:
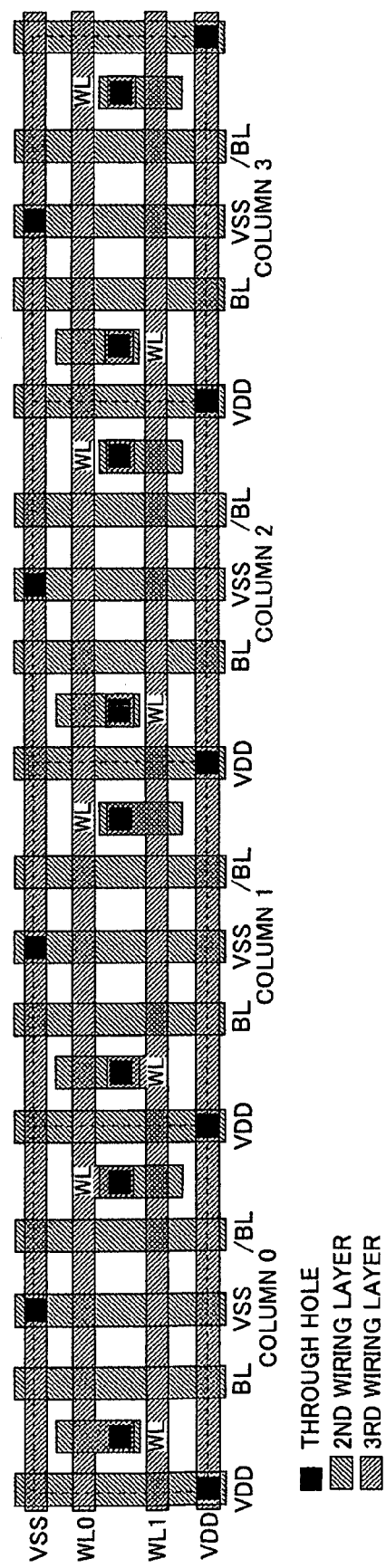
FIG. 10 is a diagram illustrating a layout of the memory cells, amounting to 1 bit and 4 columns, from the second wiring layer up to a third wiring layer.

FIG. 10 is a diagram illustrating the layout of the memory cells MC, amounting to 1 bit and 4 columns, from the second wiring layer up to a third wiring layer. In FIG. 10, a leftwardly descending hatching denotes the second wiring layer, a rightwardly descending hatching denotes the third wiring layer, and a black square denotes a through hole connecting the second and third wiring layers.

Figure 11:
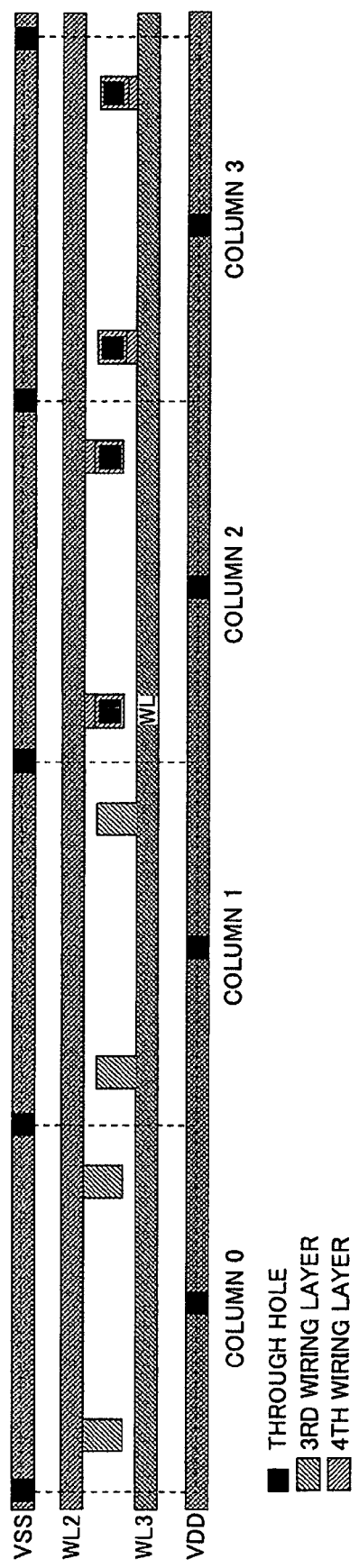
FIG. 11 is a diagram illustrating a layout of the memory cells, amounting to 1 bit and 4 columns, from the third wiring layer up to a fourth wiring layer.

FIG. 11 is a diagram illustrating the layout of the memory cells MC, amounting to 1 bit and 4 columns, from the third wiring layer up to a fourth wiring layer. In FIG. 11, a leftwardly descending hatching denotes the third wiring layer, a rightwardly descending hatching denotes the fourth wiring layer, and a black square denotes a through hole connecting the third and fourth wiring layers.

Figure 12:
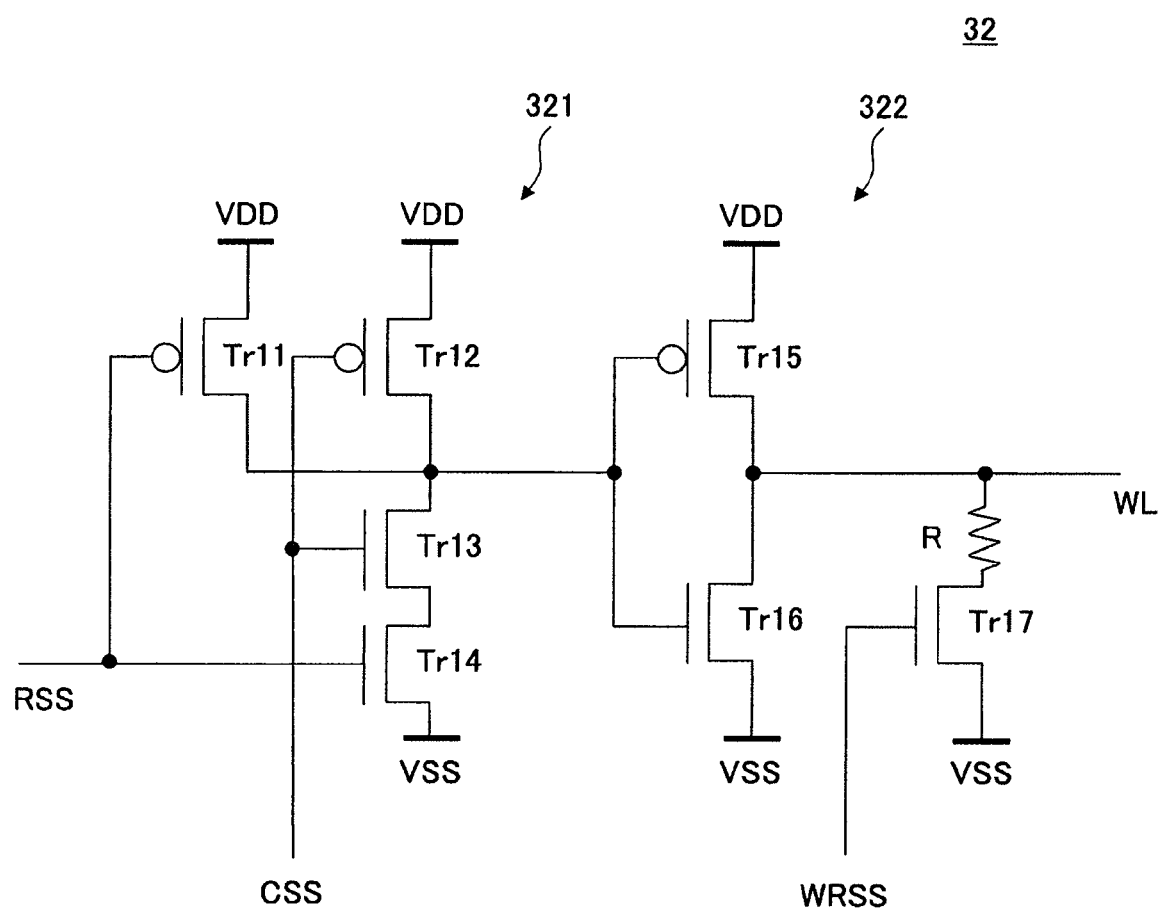
FIG. 12 is a circuit diagram illustrating a word line driver circuit.

FIG. 12 is a circuit diagram illustrating the word line driver circuit 32. The word line driver circuit 32 illustrated in FIG. 12 includes a NAND circuit 321 and a voltage variable inverter circuit 322. The NAND circuit 321 includes transistors Tr11 through Tr14 which are connected as illustrated in FIG. 12. The voltage variable inverter circuit 322 includes transistors Tr15 through Tr17 which are connected as illustrated in FIG. 12. In FIG. 12, R denotes a stray resistance of the transistor Tr17. In this case, it is unnecessary to provide a separate resistor 322-4 as in FIG. 4B, by utilizing the stray resistance R of the transistor Tr17.

Figure 13:
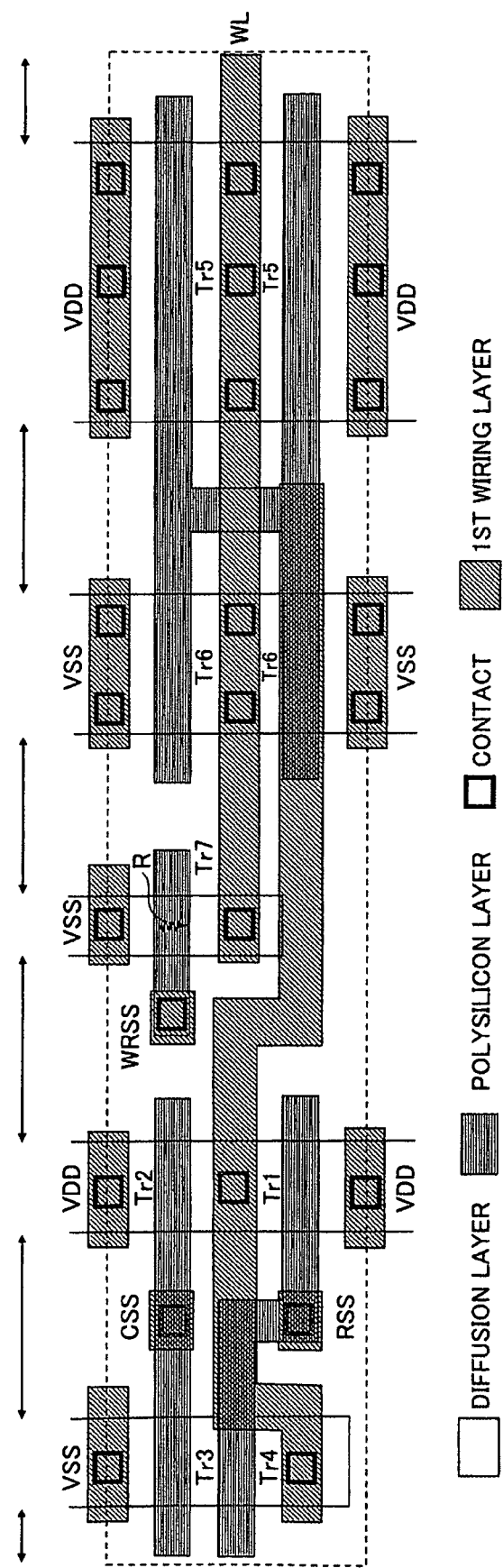
FIG. 13 is a diagram illustrating a layout of the word line driver circuit from the transistors up to the first wiring layer.

FIG. 13 is a diagram illustrating the layout of the word line driver circuit 32 from the transistors up to the first wiring layer. In FIG. 13, those parts that are the same as those corresponding parts in FIG. 12 are designated by the same reference numerals. In FIG. 13, a rectangle indicated by a thin solid line denotes the diffusion layer, a region indicated by a dark shade denotes the polysilicon layer, a leftwardly descending hatching denotes the first wiring layer, and a square indicated by a bold solid line denotes a contact between the diffusion layer and the first wiring layer or, between the polysilicon layer and the first wiring layer. In addition, ranges indicated by arrows denote sizes (or dimensions) which are determined by a design rule but do not contribute to the driving capacity of the driving transistors.

Figure 2:
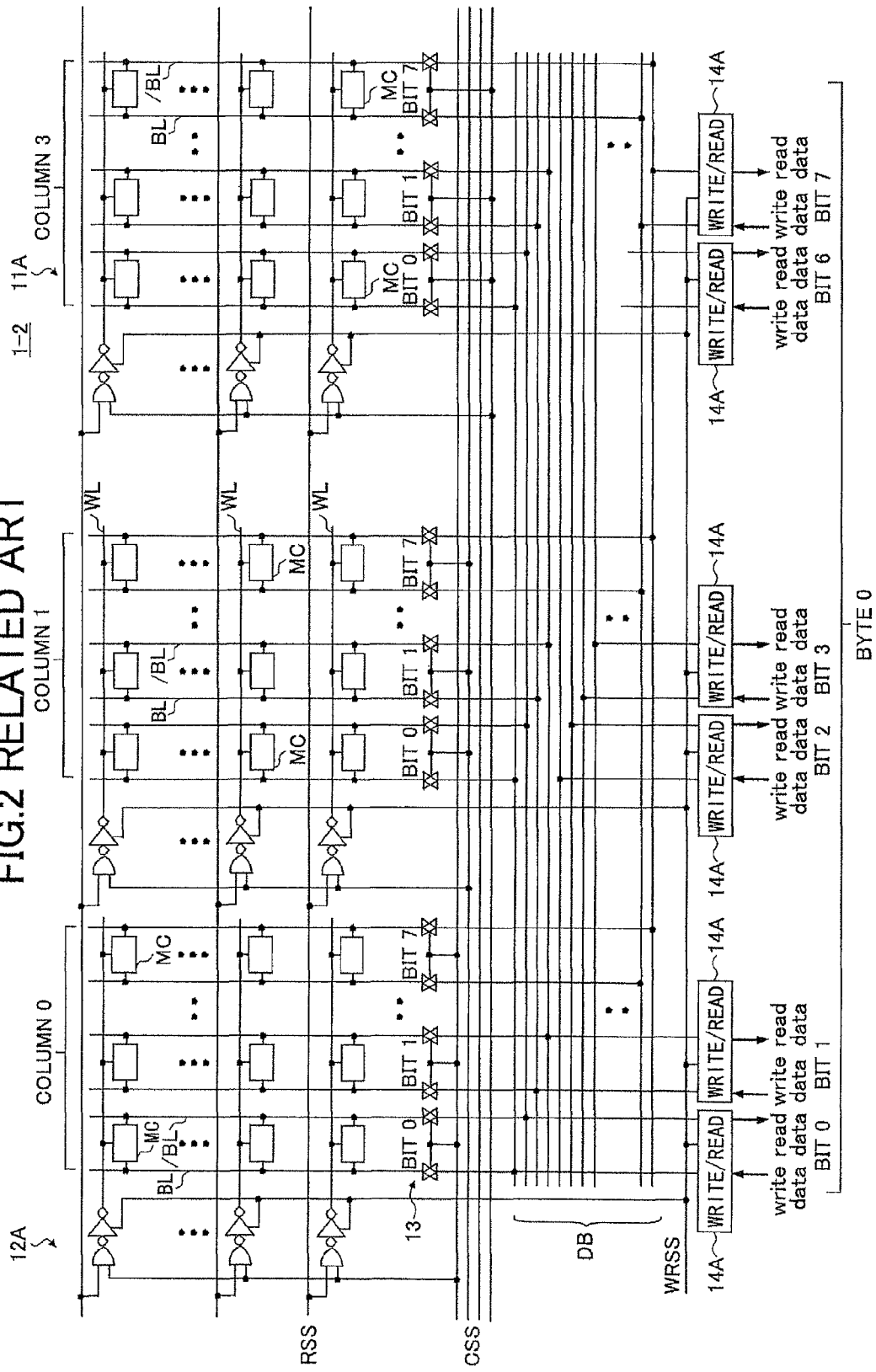
FIG. 2 is a circuit diagram illustrating a second example of the conventional semiconductor memory device.

For example, in the case of the example of the conventional semiconductor memory device illustrated in FIG. 2, the number of memory cells which are connected to the same word line WL and are to be driven simultaneously is ¼ compared to that of the embodiment illustrated in FIG. 3, and the gate width of the driving transistors may be ¼ that of the embodiment illustrated in FIG. 3. However, in the width of the word line driver circuit 12A illustrated in FIG. 2, the sizes which are determined the by the design rule but do not contribute to the driving capacity of the driving transistors occupy a considerable portion as compared to the gate width of the driving transistors. In other words, the size of one word line driver circuit 12A illustrated in FIG. 2 may be made slightly smaller than that of the embodiment illustrated in FIG. 3, but in FIG. 2 it is necessary to provide 16 word line driver circuits 12A in one row. On the other hand, the embodiment illustrated in FIG. 3 only requires four word line driver circuits 32 in one row. Therefore, the area occupied by the word line driver circuits 32 provided in the semiconductor memory device 31 illustrated in FIG. 3 is considerably small compared to the area occupied by the word line driver circuits 12A provided in the semiconductor memory device 1-2 illustrated in FIG. 2.

Figure 14:
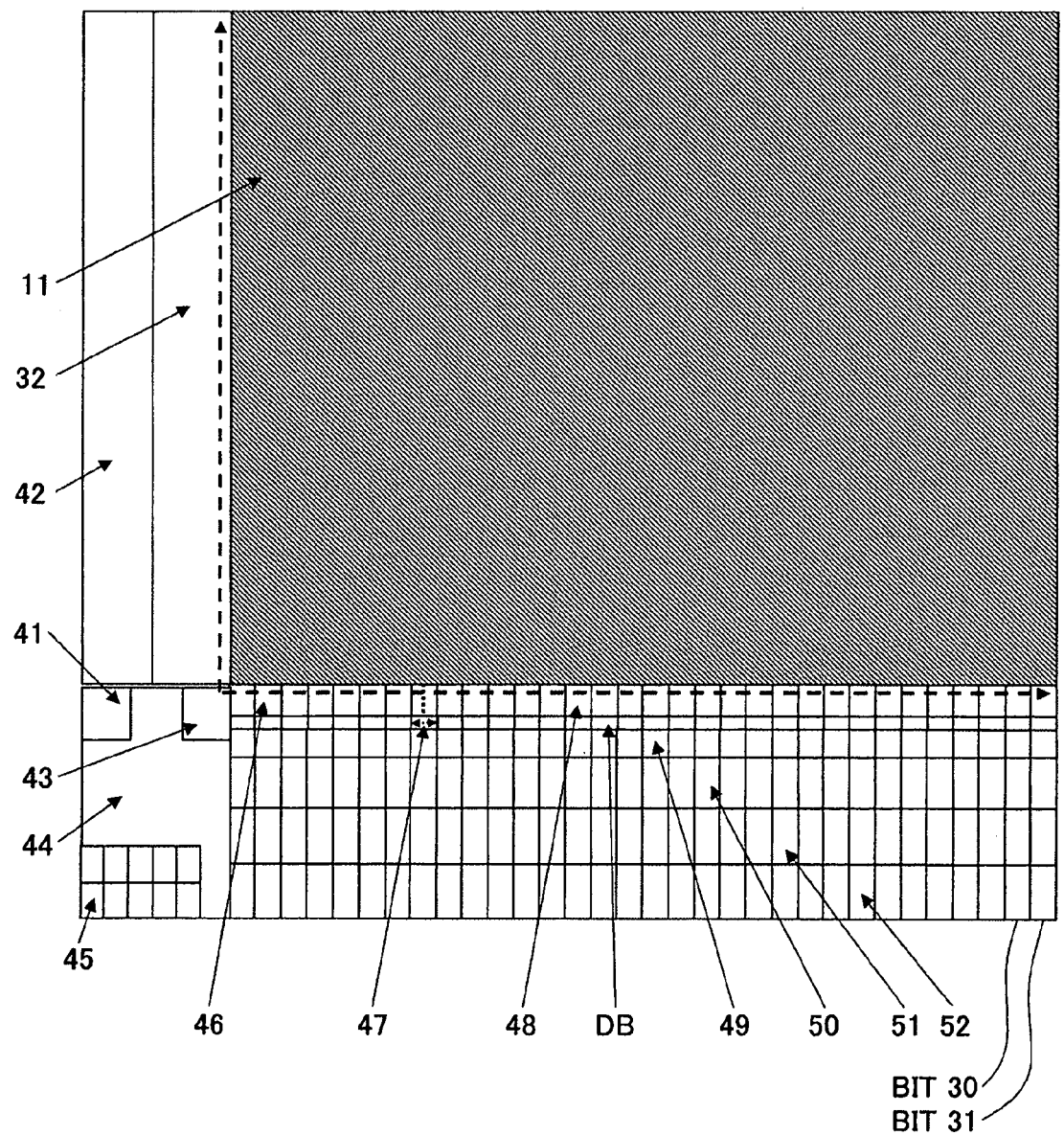
FIG. 14 is a diagram illustrating a layout of the semiconductor memory device in an example of the embodiment of the present invention.

FIG. 14 is a diagram illustrating the layout of the semiconductor memory device 31 in an example of the embodiment of the present invention. In FIG. 14, the semiconductor memory device 31 includes a memory cell array 11, a word line driver circuit 32, a row predecoder 41, a row main decoder 42, a column decoder 43, a timing generator 44, an address register 45, a wiring 46 for the column selection signal CSS having a wiring length 46, a data bus DB (or common bit lines) having a wiring length 47, a column switch 48, a write amplifier 49, a sense amplifier 50, an input and output (or input/output) register 51, and an input and output (or input/output) buffer 52. Known circuits may be used for the row predecoder 41, the row main decoder 42, the column decoder 43, the timing generator 44, the address register 45, the column switch 48, the write amplifier 49, the sense amplifier 50, the input/output register 51, and the input/output buffer 52.

FIG. 15 is a diagram illustrating the layout of the semiconductor memory device 1-2 illustrated in FIG. 2. In FIG. 15, the semiconductor memory device 1-2 includes a memory cell array 11A, a word line driver circuit 12A, a row predecoder 141, a row main decoder 142, a column decoder 143, a timing generator 144, an address register 145, a wiring 146 for the column selection signal CSS having a wiring length 146, a data bus DB (or common bit lines) having a wiring length 147, a column switch 148, a write amplifier 149, a sense amplifier 150, an input and output (or input/output) register 151, and an input and output (or input/output) buffer 152. In FIG. 15, a part surrounded by an oval dotted line is illustrated on an enlarged scale in a bottom right portion of FIG. 15. As illustrated on the enlarged scale, in one segment, dummy cells 301 are provided on both sides of an array of functional cells 300, with respect to the word line driver circuit 12A.

FIG. 15 illustrates a case where columns amounting to 8 bits are grouped for the memory cells MC amounting to {(128 rows)*(4 columns)}*{4 bytes (=32 bits)}, in the memory cell array 11A amounting to 1 kilo-words (Kwords), where "*" denotes a multiplication. In this case, the memory cell array 11A needs to be segmented into 16 segments. On the other hand, in the memory cell array, it is in general necessary to provide dummy cells in a periphery of functioning cells which actually function in a normal manner, in order to compensate for the characteristic deteriorations and the pattern defects of the memory cells MC generated due to discontinuities occurring at exposure and processing stages of the production process. But if such measures are applied to the memory cell array 11A, the functioning cells amounting to 8 columns will be included in each of the 16 segments, and further, 2 dummy cells will provided in each segment, and as a result, each segment will require the width of the memory cells MC amounting to 10 columns.

On the other hand, in the case of the semiconductor memory device 31 illustrated in FIG. 14, even when the measures are taken to surround the outer periphery of the functioning cells by the dummy cells, the width of the memory cell array 11 can be reduced by approximately 20% when compared to width of the memory cell array 11A of the semiconductor memory device 1-2.

As a result, the width of the memory cell array 11 of the semiconductor memory device 31 illustrate in FIG. 3, that is, the size in the horizontal direction in FIG. 3, can be reduced to approximately ⅔ the width of the memory cell array 11A of the semiconductor memory device 1-2 illustrated in FIG. 2.

In addition, in the case of the semiconductor memory device 1-2 illustrated in FIG. 2, the wiring length 147 of the data bus DB corresponds to 4 word line driver circuits 12A in addition to the 40 columns. On the other hand, in the case of the semiconductor memory device 31 illustrated in FIG. 3, the wiring length 47 of the data bus DB only corresponds to 4 columns, and the wiring stray capacitance can be suppressed to approximately ⅒ when compared to that of the semiconductor memory device 1-2 illustrated in FIG. 2. Accordingly, even if memory cells that are driven by a relatively small driving current are used for the memory cells MC in the semiconductor memory device 31 illustrated in FIG. 3, there is no performance deterioration compared to the semiconductor memory device 1-1 illustrated in FIG. 1, for example. Moreover, the performance deterioration which is generated by a delay caused by the wiring length of the data bus DB in the case of the semiconductor memory device 1-2 illustrated in FIG. 2 will not occur in the case of the semiconductor memory device 31 illustrated in FIG. 3.

In general, the load of the column selection signal CSS is large, and the column selection signal CSS may become a critical cause of the delay from the performance perspective of the semiconductor memory device. In the case of the semiconductor memory device 1-2 illustrated in FIG. 2, it is necessary to distribute the column selection signal CSS to the word line driver circuits 12A in units of each column. But in the case of the semiconductor memory device 31 illustrated in FIG. 3, it is sufficient to distribute the single wiring 46 of the column selection signal CSS to the main decoder part, and the wiring length of the wiring 46 of the column selection signal CSS can be reduced to approximately ⅓ the wiring length of the wiring 146 of the column section signal CSS in the semiconductor memory device 1-2 illustrated in FIG. 2.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory device comprising:
    a memory cell array provided with a plurality of blocks each having a plurality of memory cells arranged in a plurality of columns and a plurality of rows;
    a column selection circuit configured to select a column via bit lines based on a column section signal;
    a word line driver circuit configured to select a row via a word line based on a row selection signal and the column selection signal; and
    a write and read circuit configured to write data to and to read data from a selected memory cell, via the bit lines, based on a write and read switching signal, said selected memory cell being arranged at a position determined by the column selected by the column selection circuit and the row selected by the word line driver circuit within one block,
    wherein rows corresponding to the plurality of blocks are provided in common with the same number of word lines as the plurality of columns, and the memory cells arranged in one row within one block are coupled to mutually different word lines,
    wherein a half of the number of word lines within one block are provided on a first wiring layer, and a remaining half of the number of word lines within said one block are provided on a second wiring layer different from the first wiring layer, and
    wherein the memory cell array includes a complementary metal oxide semiconductor static random access memory (CMOS-SRAM) having 6-transistor type memory cells.

2. The semiconductor memory device as claimed in claim 1, wherein the word line driver circuit inverts a signal that is output to a word line of the selected row based on the write and read switching signal.

3. The semiconductor memory device as claimed in claim 1, wherein the column selection circuit and the write and read circuit are respectively provided with respect to each block.

4. The semiconductor memory device as claimed in claim 1, wherein a potential of the word line at a time of writing is set to a voltage higher than a potential of the word line at a time of reading.

5. The semiconductor memory device as claimed in claim 4, wherein the potential of the word line at the time of writing is set to a power supply voltage.

6. The semiconductor memory device as claimed in claim 1, wherein a potential of the word line at a time of writing is set to a first power supply voltage, and a potential of the word line at a time of reading is set to a second power supply voltage which is lower than the first power supply voltage.

7. The semiconductor memory device as claimed in claim 1, wherein the word line driver circuit comprises, with respect to each word line, a NAND circuit configured to receive one bit of the row selection signal and one bit of the column selection signal, and a voltage variable inverter circuit configured to invert an output signal of the NAND circuit and to output a signal having a different potential in response to the write and read switching signal.

8. The semiconductor memory device as claimed in claim 7, wherein the voltage variable inverter circuit comprises:
    an output terminal coupled to said one word line;
    an inverter configured to receive the output signal of the NAND circuit and to output an output signal to the output terminal;
    a load coupled to the output terminal; and
    a transistor having a gate that receives the write and read switching signal, a source that is coupled to the output terminal, and a drain that is grounded.

9. The semiconductor memory device as claimed in claim 8, wherein the source includes an internal resistance functioning as the load.

* * * * *